(12) United States Patent
Jheng (10) Patent No.: US 11,031,316 B2
(45) Date of Patent: Jun. 8, 2021

(54) RETAINER

(71) Applicant: COOLER MASTER CO., LTD., New Taipei (TW)

(72) Inventor: Yan-Sian Jheng, New Taipei (JP)

(73) Assignee: COOLER MASTER CO., LTD., New Taipei (TW)

( * ) Notice: Subject to any disclaimer, the term of this patent is extended or adjusted under 35 U.S.C. 154(b) by 0 days.

(21) Appl. No.: 16/587,188

(22) Filed: Sep. 30, 2019

(65) Prior Publication Data

US 2020/0027817 A1  Jan. 23, 2020

Related U.S. Application Data

(63) Continuation of application No. 15/990,315, filed on May 25, 2018, now Pat. No. 10,529,647.

(30) Foreign Application Priority Data

May 25, 2017 (CN) .......................... 201720593806.5
May 21, 2018 (CN) ............................ 20180757439.2

(51) Int. Cl.
*A47B 97/00* (2006.01)
*H01L 23/40* (2006.01)
*F16M 13/02* (2006.01)

(52) U.S. Cl.
CPC ......... *H01L 23/4093* (2013.01); *F16M 13/02* (2013.01); *H01L 23/4006* (2013.01)

(58) Field of Classification Search
CPC ...... F16B 2/20; F16M 13/02; F16M 2200/02; H01L 23/40; H01L 2023/405; H01L 23/4093
See application file for complete search history.

(56) References Cited

U.S. PATENT DOCUMENTS

| | | | | |
|---|---|---|---|---|
| 6,229,705 B1 * | 5/2001 | Lee | ...................... | H01L 23/4093 165/80.3 |
| 6,466,445 B1 * | 10/2002 | Chen | .................... | H01L 23/4093 24/458 |
| 6,501,656 B1 * | 12/2002 | Peng | ................... | H01L 23/4093 248/510 |
| 7,061,764 B2 * | 6/2006 | Lai | ...................... | H01L 23/4093 165/80.3 |
| 7,375,965 B2 * | 5/2008 | Xia | ..................... | H01L 23/4093 165/80.3 |

(Continued)

*Primary Examiner* — Amy J. Sterling
(74) *Attorney, Agent, or Firm* — Dickinson Wright PLLC (57) ABSTRACT

The disclosure provides a retainer which is configured to be mounted on and fix heat dissipation module onto chip platform. The retainer includes pressing portion, first and second latching portions. The first latching portion includes flat portion and flexible curved portion, the flexible curved portion is connected between the pressing portion and the flat portion, long side of the flat portion is substantially perpendicular to a long side of the pressing portion. The second latching portion is connected to the pressing portion. A long side of the second latching portion is substantially perpendicular to the long side of the pressing portion. The first portion and the second latching portion are configured to be detachably engaged at two opposite sides of the chip platform so as to deform the flexible curved portion and utilize the flexible curved portion to enhance a pressing force applied to the heat dissipation module.

30 Claims, 8 Drawing Sheets

(56) References Cited

U.S. PATENT DOCUMENTS

| | | | |
|---|---|---|---|
| 7,606,037 B2* | 10/2009 | Chang | H01L 23/4093 165/80.3 |
| 7,746,646 B2* | 6/2010 | Kuo | H01L 23/4093 361/709 |
| 10,529,647 B2* | 1/2020 | Jheng | H01L 23/4093 |
| 2005/0066487 A1* | 3/2005 | Zhang | H01L 23/427 24/457 |
| 2006/0034057 A1 | 2/2006 | Yang | |
| 2010/0181059 A1 | 7/2010 | Lin | |
| 2010/0271786 A1 | 10/2010 | Yeh et al. | |
| 2014/0262148 A1 | 9/2014 | Lin et al. | |

* cited by examiner

RETAINER

CROSS-REFERENCE TO RELATED APPLICATIONS

This non-provisional application is a continuation of U.S. patent application Ser. No. 15/990,315, filed May 25, 2018, which claims priority under 35 U.S.C. § 119(a) on Patent Application No(s). 201720593806.5 filed in China on May 25, 2017, and on Patent Application No(s). 201820757439.2 filed in China on May 21, 2018, the entire contents of which are hereby incorporated by reference.

TECHNICAL FIELD

The disclosure is related to a fixing assembly, more particularly to a retainer.

BACKGROUND

In prior art, the heat dissipation module is usually mounted on a bracket which is fixed on a CPU platform via spring screws. Although this configuration can fix the heat dissipation module in place, the use of it has a certain limitation. For example, this configuration is not adaptive to an AMD system, and the installation of the heat dissipation module and the bracket is inconvenient. Thus, it is desirable to provide a retainer which is able to overcome the above issues.

SUMMARY

Accordingly, the present disclosure provides a retainer which is capable of solving the aforementioned issues such as inconvenience of installation.

One embodiment of the present disclosure provides a retainer which is configured to be mounted on a heat dissipation module and to fix the heat dissipation module onto a chip platform. The retainer includes a pressing portion, a first latching portion and a second latching portion. The first latching portion, includes a flat portion and a flexible curved portion which are connected to each other. The flexible curved portion is located between and connected to an end of the pressing portion and the flat portion, wherein a long side of the flat portion of the first latching portion is substantially perpendicular to a long side of the pressing portion. The second latching portion is connected to another end of the pressing portion, wherein a long side of the second latching portion is substantially perpendicular to the long side of the pressing portion. The flat portion of the first latching portion and the second latching portion are configured to be detachably engaged at two opposite sides of the chip platform so as to deform the flexible curved portion and utilize the deformation of the flexible curved portion to enhance a pressing force of the pressing portion applied to the heat dissipation module.

Another embodiment of the present disclosure provides a retainer which is configured to be mounted on a heat dissipation module and to fix the heat dissipation module onto a chip platform. The retainer includes a pressing portion, a first latching portion and a second latching portion. The pressing portion is configured to press against the heat dissipation module. The first latching portion is connected to an end of the pressing portion, wherein a long side of the first latching portion is substantially perpendicular to a long side of the pressing portion. The second latching portion is connected to another end of the pressing portion, wherein a long side of the second latching portion is substantially perpendicular to the long side of the pressing portion, the first latching portion and the second latching portion each have a latching end, and the latching ends are configured to be respectively detachably engaged at two opposite sides of the chip platform. The pressing portion has a curved part which protrudes from a side of the pressing portion facing the latching ends and is configured to press against the heat dissipation module.

Another embodiment of the present disclosure provides a retainer which is configured to be mounted on a heat dissipation module and to fix the heat dissipation module onto a chip platform. The retainer includes a pressing portion, a first latching portion, a second latching portion and a locking switch. The pressing portion has a first end and a second end opposite to each other, and is configured to press against the heat dissipation module. The first latching portion is connected to the first end of the pressing portion, wherein a long side of the first latching portion is substantially perpendicular to a long side of the pressing portion. The second latching portion is disposed through the second end so that the second end is slidably along the second latching portion, wherein a long side of the second latching portion is substantially perpendicular to the long side of the pressing portion, and the first latching portion and the second latching portion each have a latching end, and the latching ends are configured to be respectively detachably engaged at two opposite sides of the chip platform. The locking switch is pivotally coupled on the second latching portion and pivotable between a locking position and a released position, wherein the second end is located between the locking switch and the latching end of the second latching portion; when the locking switch is in the released position, the second end and the latching end of the second latching portion are spaced by a first distance; when the locking switch is in the locking position, the second end and the latching end of the second latching portion are spaced by a second distance, and the second distance is less than the first distance.

According to the retainer as discussed in above, the retainer of the present disclosure is not only able to fix the heat dissipation module in position but also able to enhance the contact force between the heat dissipation module and the chip, thereby improving the heat dissipation efficiency of the heat dissipation module.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known main structures and devices are schematically shown in order to simplify the drawing.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known main structures and devices are schematically shown in order to simplify the drawing.

Moreover, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained unless the terms have a specific meaning in the present disclosure.

Figure 1:
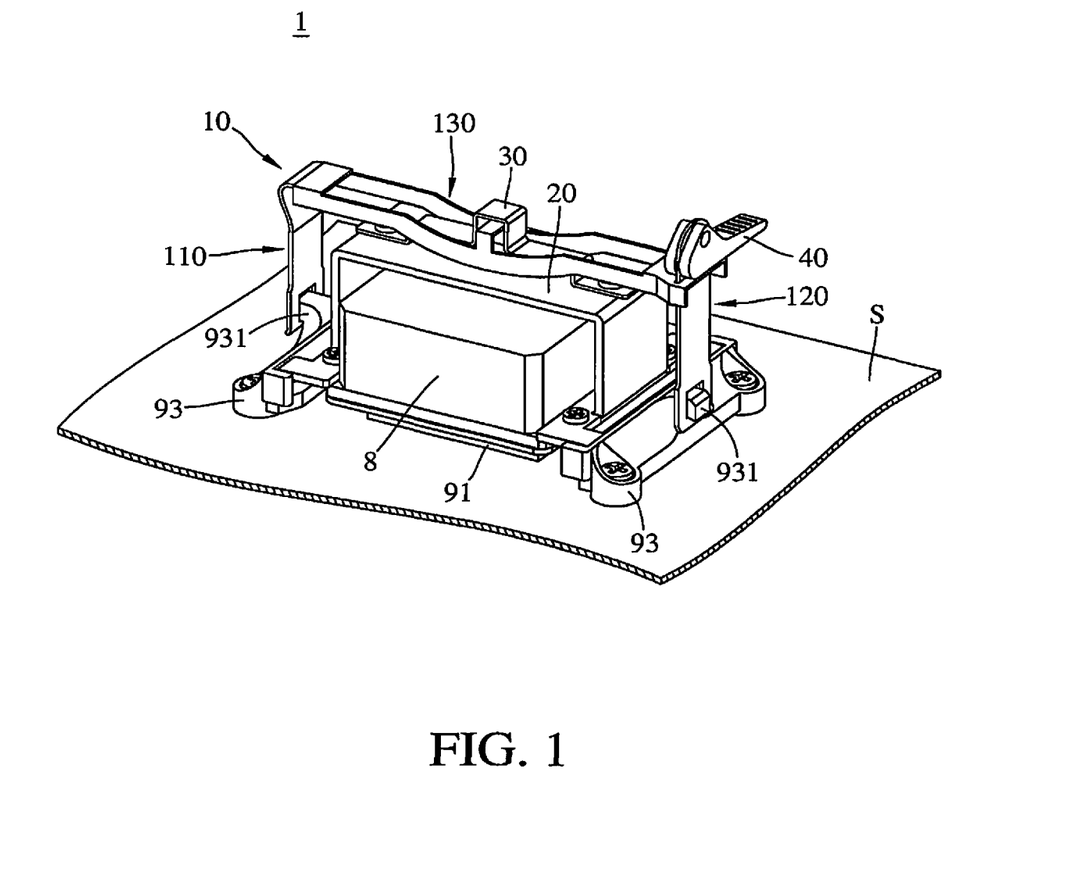
FIG. 1 is a perspective view of a retainer according to one embodiment of the disclosure being disposed on a chip platform.
Figure 2:
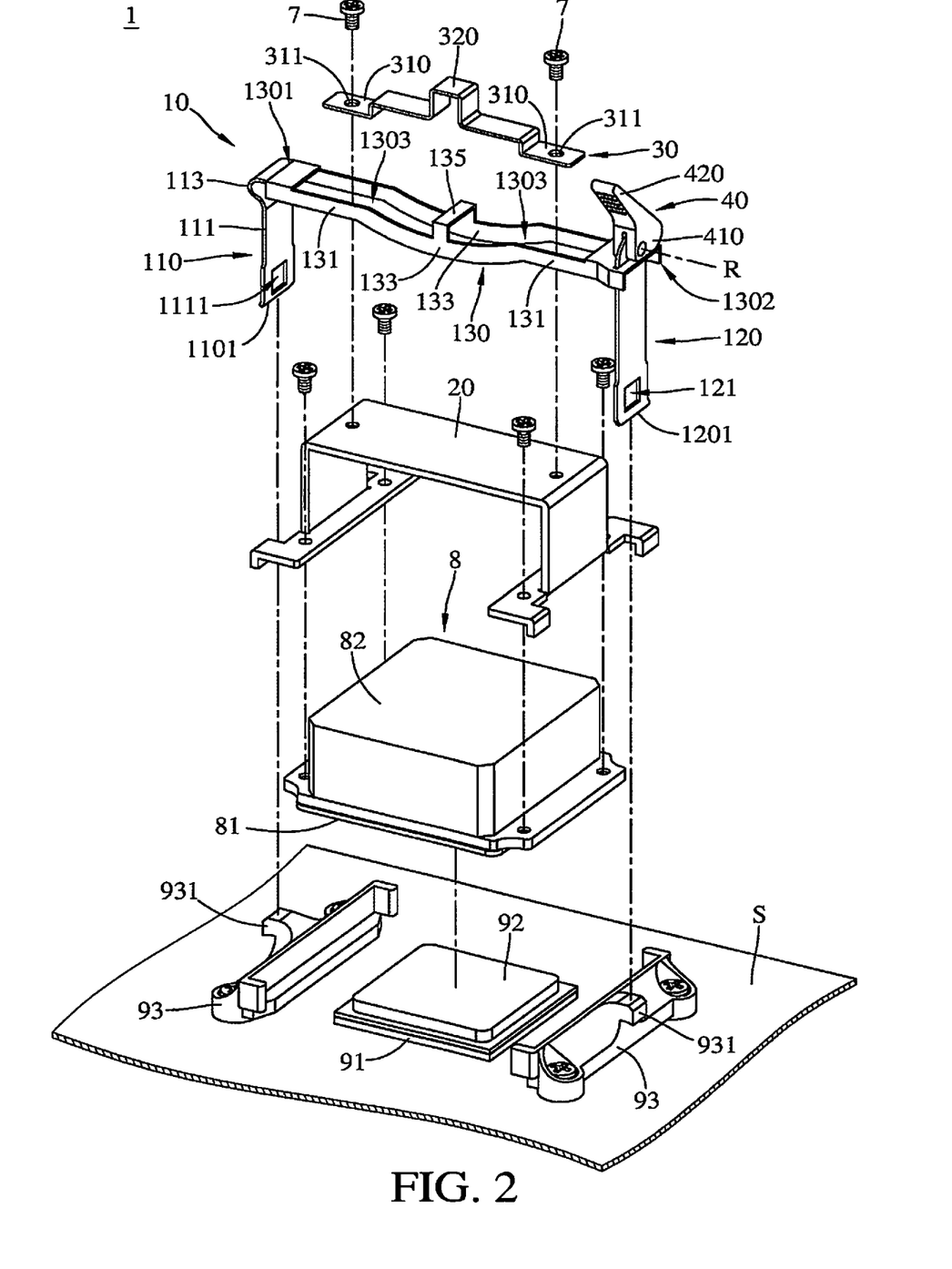
FIG. 2 is an exploded view of the retainer in FIG. 1.

Firstly, please refer to FIGS. 1 to 2, FIG. 1 is a perspective view of a retainer according to one embodiment of the disclosure being disposed on a chip platform, and FIG. 2 is an exploded view of the retainer in FIG. 1.

This embodiment provides a retainer 1 which is configured to be mounted on a heat dissipation module 8 and to fix the heat dissipation module 8 on the chip platform 91 by engaging with two locking brackets 93 respectively located at two opposite sides of the chip platform 91. In this embodiment, the heat dissipation module 8 is, for example, a liquid cooling heat dissipation module which is able to become a part of a cooling circulation via a piping (not shown); alternatively, in some other embodiments, the heat dissipation module may be a fan. The chip platform 91 is adaptive to be mounted on a mounting surface S. The mounting surface S is, for example, a mounting surface of a circuit board. The chip platform 91 is a platform for an installation of an electronic device, such as a CPU chip 92 (also can be called a chip 92), and the locking brackets 93 each has a hook 931 for the engagement of the retainer 1. As shown the figures, the heat dissipation module 8 has a heat absorbing surface 81 configured to be in contact with the chip 92 so as to absorb heat generated by the chip 92 and therefore cool the chip 92.

Then, the retainer 1 will be discussed in greater detail below. In this embodiment, the retainer 1 includes a retaining member 10, a supporting member 20, a holding member 30 and a locking switch 40.

The retaining member 10 includes a first latching portion 110, a second latching portion 120 and a pressing portion 130. The pressing portion 130 is connected to and located between the first latching portion 110 and the second latching portion 120, and a long side of the first latching portion 110 and a long side of the second latching portion 120 both are substantially perpendicular to a long side of the pressing portion 130. As the term "substantially perpendicular" used herein means that the angle of the intersection of the lengths of the first latching portion 110 and the pressing portion 130 and the angle of the intersection of the lengths of the second latching portion 120 and the pressing portion 130 may each be 90 degrees±15 degrees which varies depending on the tolerance and the deformation caused by the force applied on the retaining member 10. That is, the first latching portion 110, the second latching portion 120 and the pressing portion 130 together form an inverted U-shaped like structure.

In more detail, the first latching portion 110 includes a flat portion 111 and a flexible curved portion 113 which are connected to each other. The flat portion 111 is flat in shape, and the flexible curved portion 113 is a curved plate. The flexible curved portion 113 is located between and connected to the flat portion 111 and the pressing portion 130. The flat portion 111 and the flexible curved portion 113 is made of a single piece. However, in another embodiment, the flat portion and the flexible curved portion may be two independent objects that are connected to each other. In addition, the first latching portion 110 has a first latching end 1101 located away from the flexible curved portion 113, and the flat portion 111 has a first eye 1111 located adjacent to the first latching end 1101. The first eye 1111 is configured to be engaged with one of the hooks 931. Furthermore, when a force is applied on the flat portion 111 along the lengthwise of the flat portion 111, the flexible curved portion 113 may be deformed so as to allow the flat portion 111 to move a bit of away from or close to the pressing portion 130.

Figure 4:
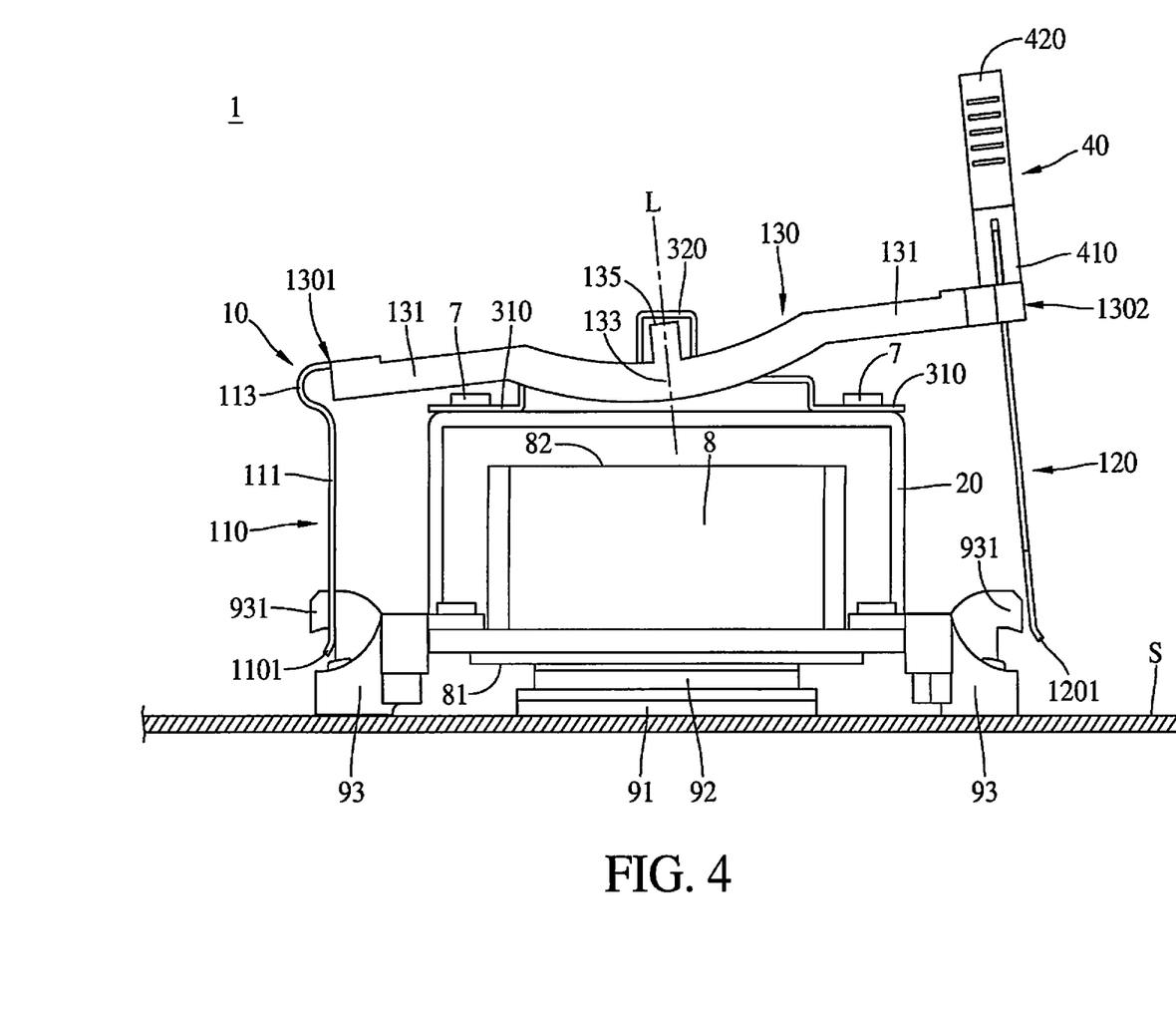
Figure 6:
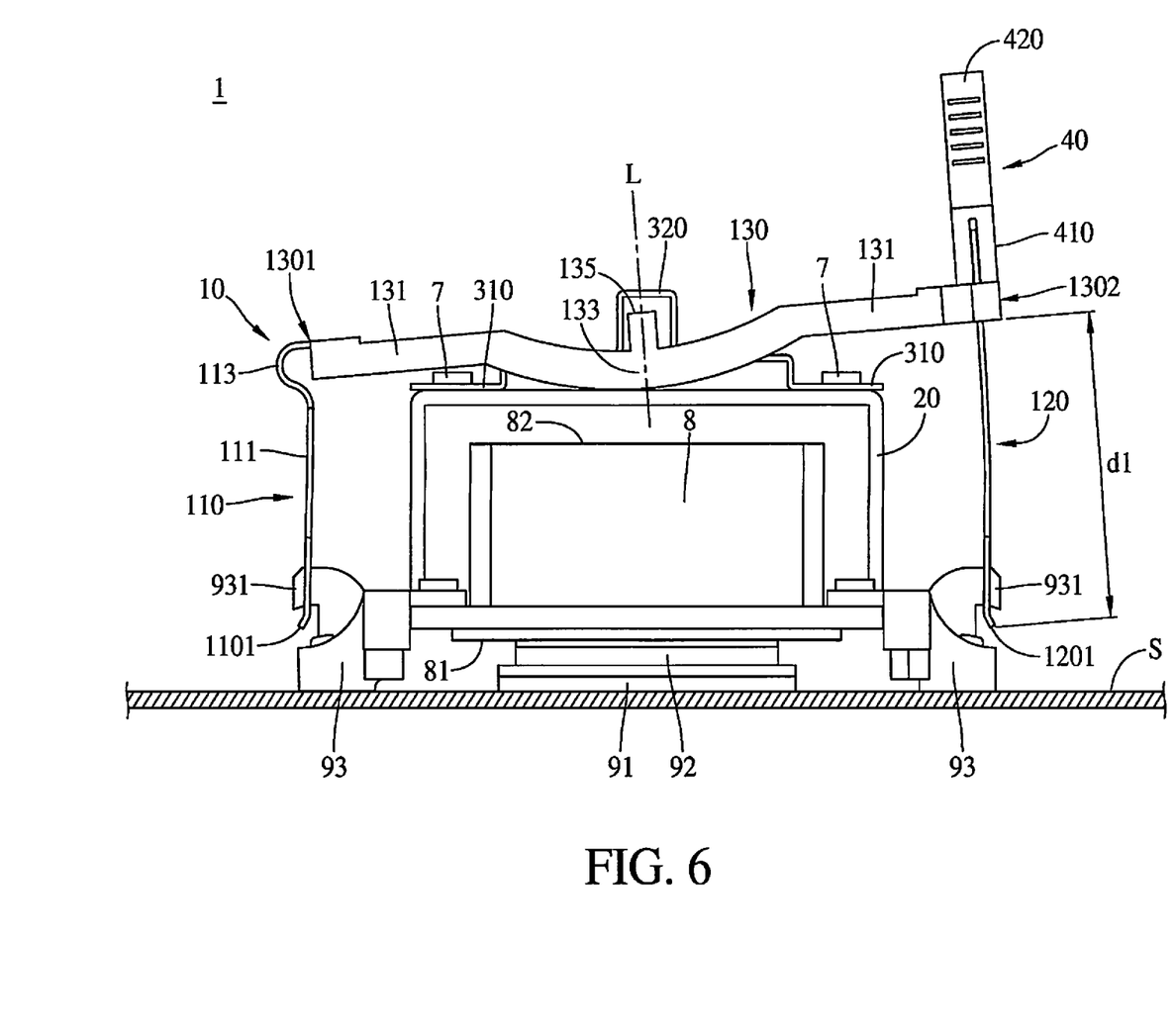

The pressing portion 130 has a first end 1301 and a second end 1302 which are opposite to each other. The first end 1301 is connected to the flexible curved portion 113; that is, the flexible curved portion 113 is connected to and located between the first end 1301 of the pressing portion 130 and the flat portion 111. Also, in this embodiment, the pressing portion 130 includes two straight parts 131, a curved part 133 and a raised part 135. The curved part 133 is connected to and located between the two straight parts 131 and protrudes toward the supporting member 20. The first end 1301 and the second end 1302 are respectively located on the two straight parts 131. The raised part 135 protrudes from a side of the curved part 133 which faces away from the first latching end 1101 of the first latching portion 110 and a second latching end 1201 of the second latching portion 120. In addition, as shown in FIG. 4 or 6, in this embodiment, the curved part 133 has an imaginary symmetry L. The distance between the imaginary symmetry centerline L and the first latching portion 110 is the same as the distance between the imaginary symmetry centerline L and the second latching portion 120. Furthermore, the two straight parts 131, the curved part 133, and the raised part 135 are made of a single piece, and the pressing portion 130 has two empty spaces 1303 which are beneficial to reduce the weight of the pressing portion 130. And the raised part 135 is located between the two empty spaces 1303.

Similarly, the second latching portion 120 is, for example, made of a single piece, and has a second eye 121 which is located adjacent to the second latching end 1201. The second eye 121 is configured to be engaged with the other hook 931. In this embodiment, when the first latching portion 110 and the second latching portion 120 are respectively engaged with the hooks 931, the first latching portion 110 and the second latching portion 120 each is in an engaged state.

The differences between the second latching portion 120 and the first latching portion 110 are that the second latching portion 120 is longer and has no curved portion, and the second latching portion 120 is disposed through the second end 1302 of the pressing portion 130 so that the second end 1302 is slidable along the second latching portion 120.

Figure 7:
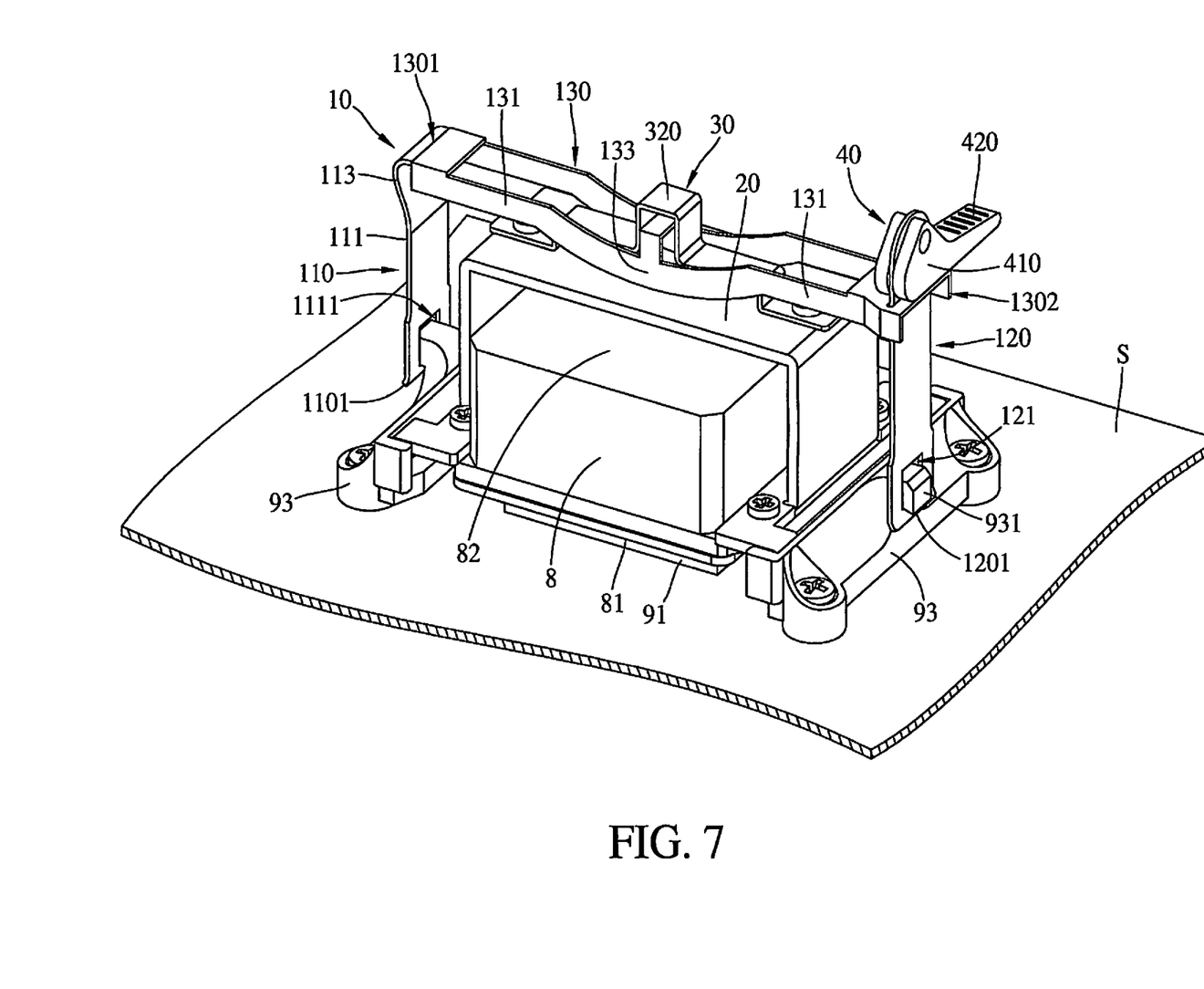
Figure 8:
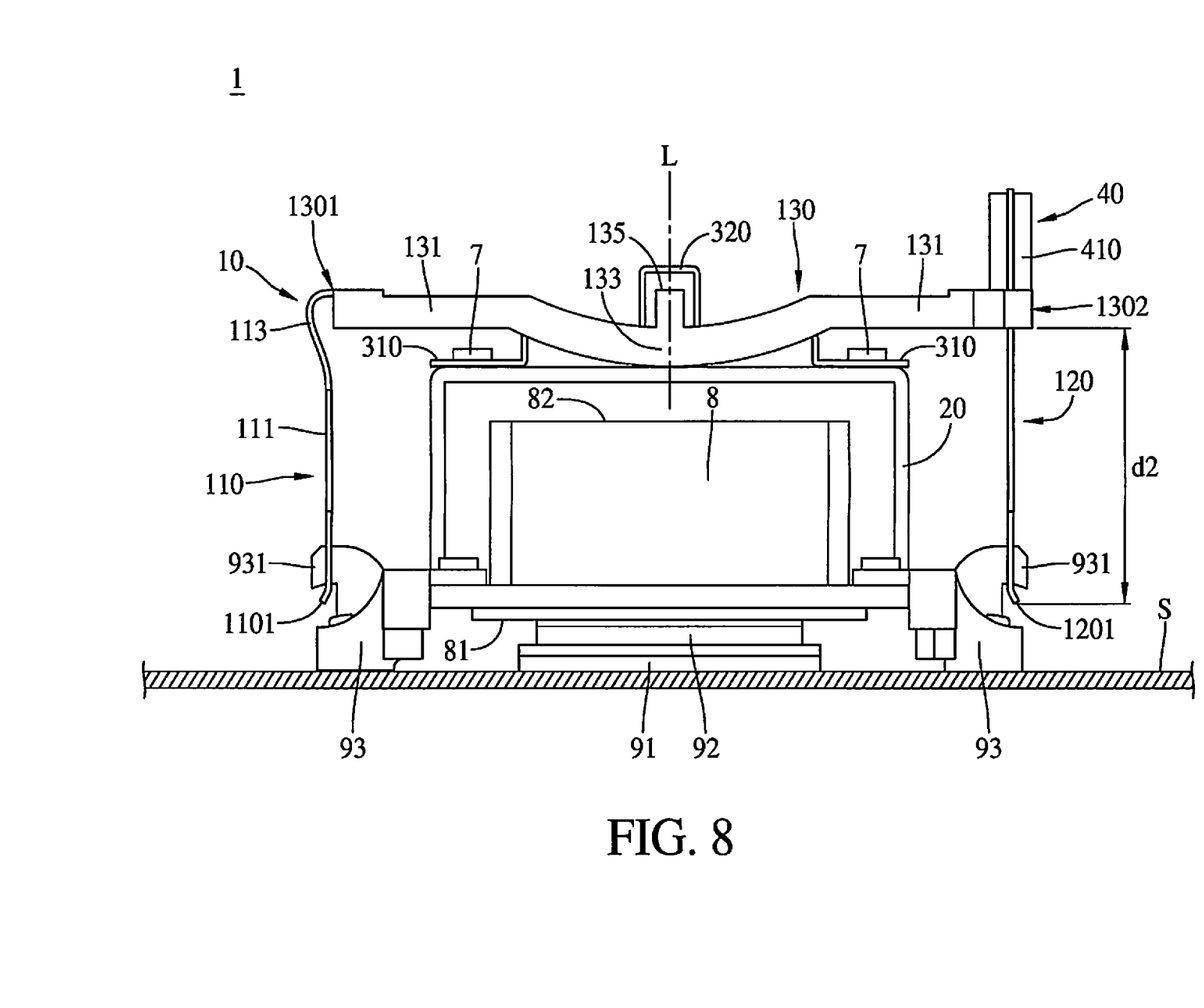

The locking switch 40 is pivotally coupled on the second latching portion 120 so as to be pivotable between a locking position (as shown in FIG. 1 and FIGS. 7-8) and a released position (as shown in FIGS. 3-6). The locking switch 40 limits the movement of the second end 1302 of the pressing portion 130 between the locking switch 40 and the second latching end 1201 of the second latching portion 120; in other words, the second end 1302 is located between the locking switch 40 and the second latching end 1201 of the second latching portion 120, such that the second end 1302 is only allowed to be moved between the locking switch 40 and the second latching end 1201 of the second latching portion 120.

In more detail, the locking switch 40 includes an eccentric cam portion 410 and an operation portion 420. The eccentric cam portion 410 is pivotally coupled on the second latching portion 120, but its rotation axis R is eccentric. The operation portion 420 protrudes from a side of the eccentric cam portion 410, such that a user is able to pivot the eccentric cam portion 410 about the rotation axis R by moving the operation portion 420. With the help of the shape of the eccentric cam portion 410, the pivot movement of the eccentric cam portion 410 (e.g., while the locking switch 40 is switched to the released position or the locking position) can decrease or increase the movable distance of the second end 1302 between the locking switch 40 and the second latching end 1201 of the second latching portion 120, this will be shown in other figures and discussed in greater detail below.

The supporting member 20 is a converted U-shaped like structure which is configured to be mounted above a top surface 82 of the heat dissipation module 8 and thus be able to receive the pressing force from the pressing portion 130.

The holding member 30 includes two fixing portions 310 and a covering portion 320. The covering portion 320 is located between and connected to the two fixing portions 310, and the fixing portions 310 and the covering portion 320 are made of a single piece. The two fixing portions 310 each have a screw hole 311. The covering portion 320 is configured to receive the raised part 135 of the pressing portion 130 so as to let the fixing portions 310 to respectively penetrate through the empty spaces 1303 of the pressing portion 130 to be fixed on the supporting member 20. For example, two screw bolts 7 are provided to disposed through the two screw holes 311 of the fixing portions 310 and fixed to the supporting member 20. When the holding member 30 is fixed onto the supporting member 20, the raised part 135 is located between the covering portion 320 and the supporting member 20, but there is still a space below the covering portion 320 for the movement of the pressing portion 130. That is, when the holding member 30 is fixed onto the supporting member 20, the pressing portion 130 is still able to be moved with respect to the supporting member 20 and the holding member 30. As such, the retaining member 10 can be movably fixed on the supporting member 20 via the holding member 30, such that and the second end 1302 of the pressing portion 130 of the retaining member 10 is slidably along the second latching portion 120.

Then, the operation of the retainer 1 is explained below. Please further refer to FIGS. 3-8, FIGS. 3 to 8 are schematic views showing the operation of the retainer in FIG. 1.

Figure 3:
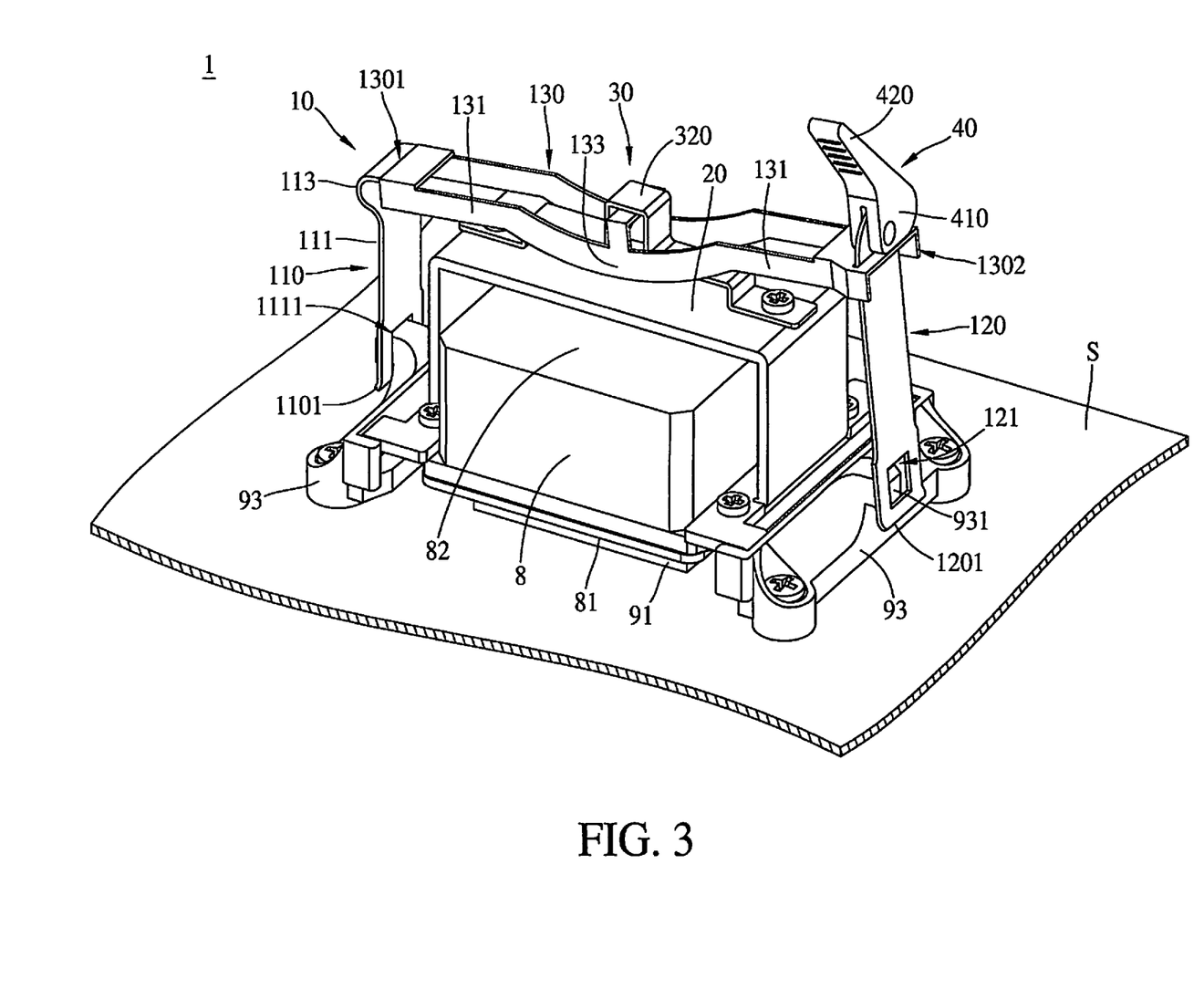
FIGS. 3 to 8 are schematic views showing the operation of the retainer in FIG. 1.

Firstly, as shown in FIGS. 3-4, the heat dissipation module 8 which is assembled to the retainer 1 is placed on the chip platform 91, then the first eye 1111 of the first latching portion 110 is engaged with the hook 931 of one of the locking brackets 93, thereby temporarily positioning the heat dissipation module 8.

Figure 5:
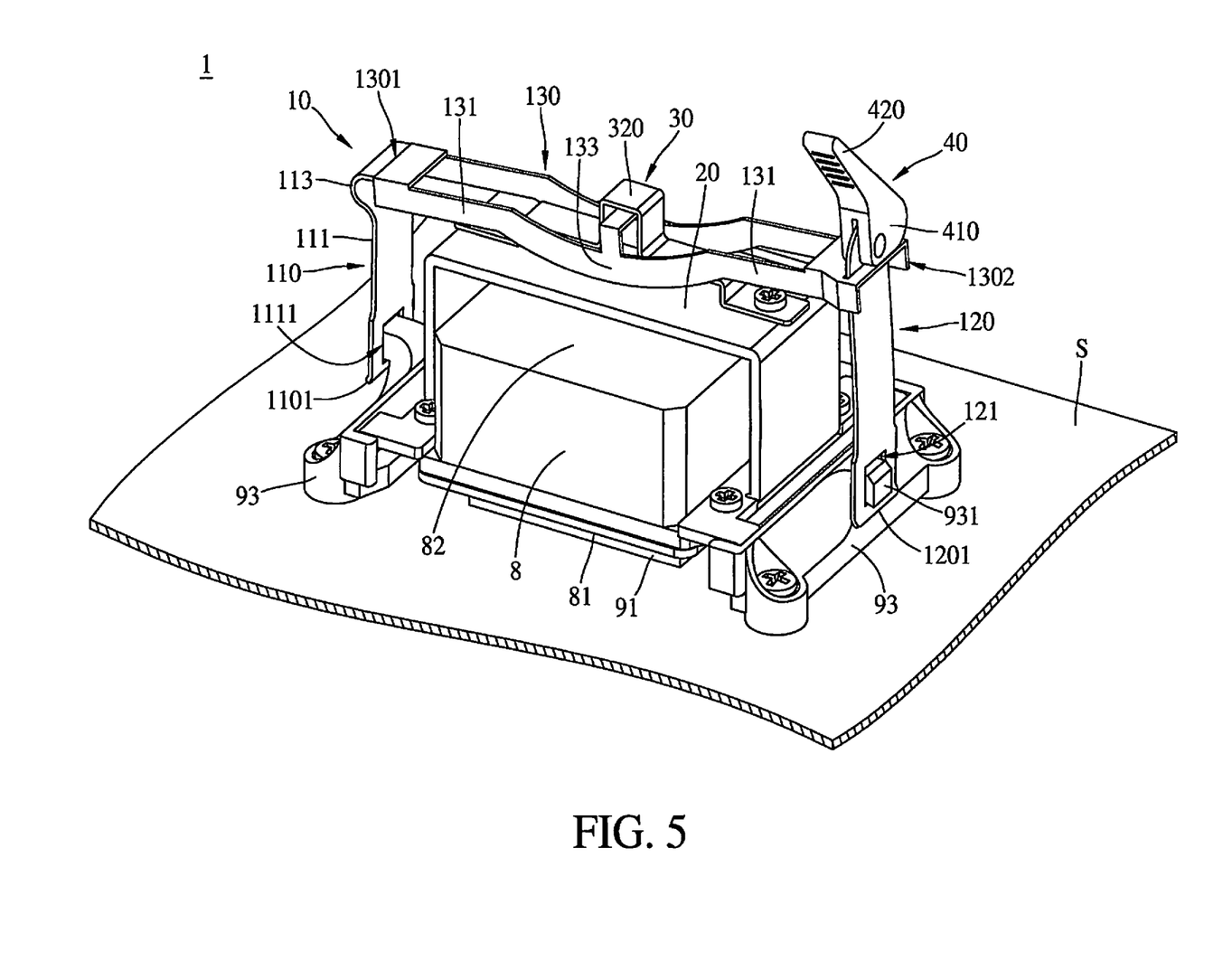

Then, as shown in FIGS. 5-6, the second eye 121 of the second latching portion 120 is engaged with the other hook 931. At this moment, the second end 1302 of the pressing portion 130 is not yet fixed in the desired position and thus the pressing portion 130 is inclined with respect to the heat dissipation module 8 (or the supporting member 20). As shown in FIG. 6, the imaginary symmetry centerline L of the curved part 133 of the pressing portion 130 is not perpendicular to the top surface 82 of the heat dissipation module 8 (or not perpendicular to the supporting member 20). In other words, at this moment, the first end 1301 and the second end 1302 are in different levels.

Lastly, as shown in FIGS. 7-8, the eccentric cam portion 410 is pivoted so as to switch the locking switch 40 to the locking position. With the help of the shape of the eccentric cam portion 410, the pivot movement of the eccentric cam portion 410 is able to push the second end 1302 downward so as to decrease the movable distance of the second end 1302 between the locking switch 40 and the second latching end 1201 of the second latching portion 120, meaning that the movement of the eccentric cam portion 410 would force the second end 1302 of the pressing portion 130 to move toward the second latching end 1201 of the second latching portion 120. As shown in FIGS. 6-8, the distance between the second end 1302 and the second latching end 1201 is reduced from a first distance d1 to a second distance d2 This strengthens the pressing force of the curved part 133 to the supporting member 20, and such pressing force is transferred to the heat dissipation module 8 via the supporting member 20 so as to further force the heat dissipation module 8 to move towards the chip platform 91, thereby enhancing the contact force between the heat absorbing surface 81 of the heat dissipation module 8 and the chip 92.

Moreover, when the locking switch 40 is switched to the locking position, the locking switch 40 may cause a slight deformation of the pressing portion 130, and the deformation helps to enhance the pressing force onto the heat dissipation module 8. Also, the pressing force is substantially applied along the imaginary symmetry centerline L of the curved part 133 which is in the middle of the first latching portion 110 and the second latching portion 120, such that the pressing force is able to be evenly applied on the heat dissipation module 8, thereby helping the heat dissipation module 8 to evenly contact the chip 92.

As discussed above, latching the retainer 1 to the locking brackets 93 at two opposite sides of the chip platform 91 is able to fix the heat dissipation module 8 in position and also able to enhance the contact force between the heat dissipation module 8 and the chip 92, thereby improving the heat dissipation efficiency of the heat dissipation module 8.

Also, the retainer 1 can be installed on the heat dissipation module 8 by few simple steps and thus the overall efficiency is further improved.

However, the present disclosure is not limited by the above embodiment. For examples, in another embodiment, the retainer may have no flexible curved portion 113 and thus the first latching portion becomes a flat structure; in still another embodiment, the retainer may have no curved part 133 and thus the pressing portion becomes a straight structure; in yet another embodiment, the retainer may have no locking switch 40, and the second latching portion and the pressing portion may be made of a single piece; in yet still another embodiment, the retainer may have no supporting member 20 and thus the pressing portion 130 can directly press against the top surface 82 of the heat dissipation module 8.

According to the retainer as discussed in above, the retainer of the present disclosure is not only able to fix the heat dissipation module in position but also able to enhance the contact force between the heat dissipation module and the chip, thereby improving the heat dissipation efficiency of the heat dissipation module.

Also, the retainer can be installed on the heat dissipation module by few simple steps and thus the overall efficiency is further improved.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A retainer, configured to be mounted on a heat dissipation module and to fix the heat dissipation module onto a chip platform, the retainer comprising:
   a pressing portion;
   a supporting member;
   a holding member;
   a first latching portion, comprising a flat portion and a flexible curved portion which are connected to each other, the flexible curved portion is located between and connected to a first end of the pressing portion and the flat portion, wherein a long side of the flat portion of the first latching portion is substantially perpendicular to a long side of the pressing portion; and
   a second latching portion, connected to a second end of the pressing portion, wherein a long side of the second latching portion is substantially perpendicular to the long side of the pressing portion;
   wherein the flat portion of the first latching portion and the second latching portion are configured to be detachably engaged at two opposite sides of the chip platform so as to deform the flexible curved portion and utilize the deformation of the flexible curved portion to enhance a pressing force of the pressing portion applied to the heat dissipation module, and
   the pressing portion comprises an empty space between the first end and the second end, and
   the holding member comprising at least a first fixing portion disposed through the empty space and fixed to the supporting member, such that at least part of the pressing portion is located between the holding member and the supporting member.

2. The retainer according to claim 1, wherein the pressing portion comprises a first side and a second side, and at least a portion of the empty space is between the first side and the second side of the pressing portion.

3. The retainer according to claim 2, further comprising a raised portion attached to the first side and the second side of the pressing portion, the raised portion spanning the portion of the empty space between the first side and the second side of the pressing portion, whereby the portion of the empty space between the first side and the second side of the pressing portion comprises a first empty space and a second empty space separated by the raised portion.

4. The retainer according to claim 1, wherein the supporting member is configured to be mounted on the heat dissipation module and located between the pressing portion and the heat dissipation module so as to be pressed against by the pressing portion.

5. The retainer according to claim 1, wherein the holding member further comprises a second fixing portion and a covering portion, the covering portion located between and connected to the first fixing portion and the second fixing portion.

6. The retainer according to claim 5, wherein:
   the pressing portion comprises
      a first side and a second side, and at least a portion of the empty space is between the first side and the second side of the pressing portion, and
      a raised portion attached to the first side and the second side of the pressing portion, the raised portion spanning the portion of the empty space between the first side and the second side of the pressing portion, whereby the portion of the empty space between the first side and the second side of the pressing portion comprises a first empty space and a second empty space separated by the raised portion;
   the first fixing portion is configured to be disposed through the first empty space;
   the second fixing portion is configured to be disposed through the second empty space; and
   when the first fixing portion and the second fixing portion are fixed to the supporting member, and at least the raised portion of the pressing portion is located between the covering portion and the supporting member.

7. A retainer, configured to be mounted on a heat dissipation module and to fix the heat dissipation module onto a chip platform, the retainer comprising:
   a pressing portion;
   a first latching portion, comprising a flat portion and a flexible curved portion which are connected to each other, the flexible curved portion is located between and connected to a first end of the pressing portion and the flat portion, wherein a long side of the flat portion of the first latching portion is substantially perpendicular to a long side of the pressing portion;
   a second latching portion, connected to a second end of the pressing portion, wherein a long side of the second latching portion is substantially perpendicular to the long side of the pressing portion; and
   a locking switch,
   wherein:
   the flat portion of the first latching portion and the second latching portion are configured to be detachably engaged at two opposite sides of the chip platform so as to deform the flexible curved portion and utilize the deformation of the flexible curved portion to enhance a pressing force of the pressing portion applied to the heat dissipation module, and
   the pressing portion comprises
      an empty space between the first end and the second end,
      a first end connected to the flexible curved portion of the first latching portion, and
      a second end, the second latching portion being disposed through the second end so that the second end is slidably along the second latching portion;
   the flat portion of the first latching portion comprises a first latching end;
   the flat portion of the second latching portion comprises a second latching end;
   the first latching end and the second latching end are configured to be respectively detachably engaged at the two opposite sides of the chip platform;
   the locking switch is pivotally coupled on the second latching portion and is pivotable between a locking position and a released position, the second end is located between the locking switch and the second latching end of the second latching portion;
   when the locking switch is in the released position, the second end and the latching end of the second latching portion are spaced by a first distance; and
   when the locking switch is in the locked position, the second end and the latching end of the second latching portion are spaced by a second distance, the second distance being less than the first distance.

8. The retainer according to claim 1, wherein
the pressing portion comprises a curved part located between the first end of the pressing portion and the second end of the pressing portion, and
the curved part protrudes from a side of the pressing portion facing the heat dissipation module and is configured to press against the heat dissipation module.

9. A retainer, configured to be mounted on a heat dissipation module and to fix the heat dissipation module onto a chip platform, the retainer comprising:
a pressing portion, configured to press against the heat dissipation module;
a first latching portion, connected to a first end of the pressing portion;
a second latching portion, connected to a second end of the pressing portion; and
a locking switch,
wherein
a first long side of the first latching portion is substantially perpendicular to a long side of the pressing portion,
a second long side of the second latching portion is substantially perpendicular to the long side of the pressing portion, the first latching portion having a first latching end and the second latching portion have a second latching end, the first latching end and the second latching end being configured to be respectively detachably engaged at two opposite sides of the chip platform,
the pressing portion comprises an empty space between the first end and the second end,
the second latching portion is disposed through the second end of the pressing portion so that the second end of the pressing portion is slidably along the second latching portion;
the locking switch is pivotally coupled on the second latching portion and is pivotable between a locking position and a released position;
when the locking switch is in the released position, the second end of the pressing portion and the latching end of the second latching portion are spaced by a first distance; and
when the locking switch is in the locked position, the second end of the pressing portion and the latching end of the second latching portion are spaced by a second distance, the second distance being less than the first distance.

10. The retainer according to claim 9, wherein the pressing portion comprises a curved part which protrudes from a side of the pressing portion facing the latching ends and is configured to press against the heat dissipation module.

11. The retainer according to claim 9, further comprising a flexible curved portion, wherein:
the first latching portion comprises a first flat portion connected to the flexible curved portion, the flexible curved portion being located between and connected to the first end of the pressing portion and the first flat portion, and
the first flat portion of the first latching portion and the second latching portion are configured to deform the flexible curved portion and utilize the deformation of the flexible curved portion to enhance a pressing force of the pressing portion applied to the heat dissipation module when the first latching end and the second latching end are respectively engaged at the two opposite sides of the chip platform.

12. The retainer according to claim 9, wherein
the pressing portion comprises a curved part located between the first end and the second end, and
the curved part protrudes from a side of the pressing portion facing the heat dissipation module and is configured to press against the heat dissipation module.

13. The retainer according to claim 9, further comprising a supporting member configured to be mounted on the heat dissipation module and located between the pressing portion and the heat dissipation module so as to be pressed against by the pressing portion.

14. A retainer, configured to be mounted on a heat dissipation module and to fix the heat dissipation module onto a chip platform, the retainer comprising:
a pressing portion, configured to press against the heat dissipation module;
a first latching portion, connected to a first end of the pressing portion;
a second latching portion, connected to a second end of the pressing portion;
a supporting member; and
a holding member, the holding member comprising at least a first fixing portion disposed through the empty space and fixed to the supporting member, such that at least part of the pressing portion is located between the holding member and the supporting member,
wherein
a first long side of the first latching portion is substantially perpendicular to a long side of the pressing portion,
a second long side of the second latching portion is substantially perpendicular to the long side of the pressing portion, the first latching portion having a first latching end and the second latching portion have a second latching end, the first latching end and the second latching end being configured to be respectively detachably engaged at two opposite sides of the chip platform, and
the pressing portion comprises an empty space between the first end and the second end.

15. The retainer according to claim 14, further comprising a locking switch, wherein:
the second latching portion is disposed through the second end of the pressing portion so that the second end of the pressing portion is slidably along the second latching portion;
the locking switch is pivotally coupled on the second latching portion and is pivotable between a locking position and a released position;
when the locking switch is in the released position, the second end of the pressing portion and the latching end of the second latching portion are spaced by a first distance; and
when the locking switch is in the locked position, the second end of the pressing portion and the latching end of the second latching portion are spaced by a second distance, the second distance being less than the first distance.

16. A system comprising:
a retainer;
a locking switch; and
a heat dissipation module,
wherein:
the retainer comprises
a pressing portion, having a first end and a second end opposite to each other and configured to press against the heat dissipation module, the pressing portion comprising an empty space between the first end and the second end,
a first latching portion connected to the first end of the pressing portion, a first long side of the first latching portion being substantially perpendicular to a long side of the pressing portion, and
a second latching portion connected to the second end of the pressing portion, a second long side of the second latching portion being substantially perpendicular to the long side of the pressing portion;
the first latching portion has a first latching end and the second latching portion has a second latching end;
the first latching end and the second latching end are configured to be respectively detachably engaged at two opposite sides of the chip platform;
the second latching portion is disposed through the second end of the pressing portion so that the second end of the pressing portion is slidably along the second latching portion;
the locking switch is pivotally coupled on the second latching portion and is pivotable between a locking position and a released position;
when the locking switch is in the released position, the second end of the pressing portion and the latching end of the second latching portion are spaced by a first distance; and
when the locking switch is in the locked position, the second end of the pressing portion and the latching end of the second latching portion are spaced by a second distance, the second distance being less than the first distance.

17. The system according to claim 16, further comprising a supporting member configured to be mounted on the heat dissipation module and located between the pressing portion and the heat dissipation module so as to be pressed against by the pressing portion.

18. A system comprising:
a retainer;
a heat dissipation module;
a supporting member; and
a holding member,
wherein:
the retainer comprises
a pressing portion, having a first end and a second end opposite to each other and configured to press against the heat dissipation module, the pressing portion comprising an empty space between the first end and the second end,
a first latching portion connected to the first end of the pressing portion, a first long side of the first latching portion being substantially perpendicular to a long side of the pressing portion, and
a second latching portion connected to the second end of the pressing portion, a second long side of the second latching portion being substantially perpendicular to the long side of the pressing portion;
the first latching portion has a first latching end and the second latching portion has a second latching end;
the first latching end and the second latching end are configured to be respectively detachably engaged at two opposite sides of the chip platform; and
the holding member comprising at least a first fixing portion disposed through the empty space and fixed to the supporting member, such that at least part of the pressing portion is located between the holding member and the supporting member.

19. The system according to claim 18, further comprising a locking switch, wherein:
the second latching portion is disposed through the second end of the pressing portion so that the second end of the pressing portion is slidably along the second latching portion;
the locking switch is pivotally coupled on the second latching portion and is pivotable between a locking position and a released position;
when the locking switch is in the released position, the second end of the pressing portion and the latching end of the second latching portion are spaced by a first distance; and
when the locking switch is in the locked position, the second end of the pressing portion and the latching end of the second latching portion are spaced by a second distance, the second distance being less than the first distance.

20. A method of fixing a heat dissipation module onto a chip platform, the method comprising:
mounting a retainer on the heat dissipation module, the retainer comprising
a pressing portion,
a first latching portion, comprising a flat portion and a flexible curved portion which are connected to each other, the flexible curved portion is located between and connected to a first end of the pressing portion and the flat portion, wherein a long side of the flat portion of the first latching portion is substantially perpendicular to a long side of the pressing portion,
a second latching portion, connected to a second end of the pressing portion, wherein a long side of the second latching portion is substantially perpendicular to the long side of the pressing portion,
a supporting member, and
a holding member,
wherein the pressing portion comprises an empty space between the first end and the second end, and the holding member comprising at least a first fixing portion disposed through the empty space and fixed to the supporting member;
positioning at least a part of the pressing portion between the holding member and the supporting member;
detachably engaging the flat portion of the first latching portion and the second latching portion at two opposite sides of the chip platform;
deforming the flexible curved portion; and
utilizing the deformation of the flexible curved portion to enhance a pressing force of the pressing portion applied to the heat dissipation module.

21. The method according to claim 20, wherein the pressing portion comprises a first side and a second side, and at least a portion of the empty space is between the first side and the second side of the pressing portion.

22. The method according to claim 21, where the retainer further comprises a raised portion attached to the first side and the second side of the pressing portion, the raised portion spanning the portion of the empty space between the first side and the second side of the pressing portion, whereby the portion of the empty space between the first side and the second side of the pressing portion comprises a first empty space and a second empty space separated by the raised portion.

23. The method according to claim 20 further comprising:
mounting the supporting member on the heat dissipation module between the pressing portion and the heat dissipation module; and pressing against the supporting member by the pressing portion.

24. The method according to claim 23, wherein the holding member further comprises a second fixing portion and a covering portion, the covering portion located between and connected to the first fixing portion and the second fixing portion.

25. The method according to claim 24, wherein
the pressing portion comprises:
a first side and a second side, and at least a portion of the empty space is between the first side and the second side of the pressing portion; and
a raised portion attached to the first side and the second side of the pressing portion, the raised portion spanning the portion of the empty space between the first side and the second side of the pressing portion,
whereby the portion of the empty space between the first side and the second side of the pressing portion comprises a first empty space and a second empty space separated by the raised portion,
the method further comprising:
positioning the first fixing portion through the first empty space;
positioning the second fixing portion through the second empty space; and
fixing the first fixing portion and the second fixing portion to the supporting member such that at least the raised portion of the pressing portion is located between the covering portion and the supporting member.

26. A method of fixing a heat dissipation module onto a chip platform, the method comprising:
mounting a retainer on the heat dissipation module, wherein:
the retainer comprises
a pressing portion,
a first latching portion, comprising a flat portion and a flexible curved portion which are connected to each other, the flexible curved portion is located between and connected to a first end of the pressing portion and the flat portion, wherein a long side of the flat portion of the first latching portion is substantially perpendicular to a long side of the pressing portion,
a second latching portion, connected to a second end of the pressing portion, wherein a long side of the second latching portion is substantially perpendicular to the long side of the pressing portion, and
a locking switch; and
the pressing portion comprises
an empty space between the first end and the second end,
a first end connected to the flexible curved portion of the first latching portion, and
a second end, the second latching portion being disposed through the second end so that the second end is slidably along the second latching portion;

the flat portion of the first latching portion comprises a first latching end;
the flat portion of the second latching portion comprises a second latching end;
the first latching end and the second latching end are configured to be respectively detachably engaged at the two opposite sides of the chip platform; and
the locking switch is pivotally coupled on the second latching portion and is pivotable between a locking position and a released position, the second end is located between the locking switch and the second latching end of the second latching portion;
detachably engaging the flat portion of the first latching portion and the second latching portion at two opposite sides of the chip platform;
deforming the flexible curved portion;
utilizing the deformation of the flexible curved portion to enhance a pressing force of the pressing portion applied to the heat dissipation module;
selectively moving the locking switch into the released position, whereby the second end and the latching end of the second latching portion are spaced by a first distance; and
selectively moving the locking switch into the locked position, whereby the second end and the latching end of the second latching portion are spaced by a second distance, the second distance being less than the first distance.

27. The method according to claim 20, wherein:
the pressing portion comprises a curved part located between the first end of the pressing portion and the second end of the pressing portion; and
the curved part protrudes from a side of the pressing portion facing the heat dissipation module,
the method further comprising pressing the curved part of the pressing portion against the heat dissipation module.

28. The method according to claim 27, wherein:
the retainer further comprises a supporting member;
the method further comprises mounting the supporting member on the heat dissipation module between the pressing portion and the heat dissipation module; and
the pressing against the supporting member by the pressing portion comprises pressing the curved part of the pressing portion against the supporting member.

29. The retainer according to claim 9, wherein the supporting member is configured to be mounted on the heat dissipation module and located between the pressing portion and the heat dissipation module so as to be pressed against by the pressing portion.

30. The system according to claim 18, wherein the supporting member is configured to be mounted on the heat dissipation module and located between the pressing portion and the heat dissipation module so as to be pressed against by the pressing portion.

* * * * *